United States Patent
Katz

(10) Patent No.: US 12,074,145 B2
(45) Date of Patent: Aug. 27, 2024

(54) METHOD FOR MANUFACTURING AN OPTOELECTRONIC LIGHT EMITTING DEVICE

(71) Applicant: OSRAM Opto Semiconductors GmbH, Regensburg (DE)

(72) Inventor: Simeon Katz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 493 days.

(21) Appl. No.: 17/414,234

(22) PCT Filed: Dec. 17, 2019

(86) PCT No.: PCT/EP2019/085647
§ 371 (c)(1),
(2) Date: Jun. 15, 2021

(87) PCT Pub. No.: WO2020/127264
PCT Pub. Date: Jun. 25, 2020

(65) Prior Publication Data
US 2022/0052026 A1 Feb. 17, 2022

(30) Foreign Application Priority Data
Dec. 19, 2018 (DE) ...................... 10 2018 132 824.9

(51) Int. Cl.
| | |
|---|---|
| *H01L 21/683* | (2006.01) |
| *H01L 25/075* | (2006.01) |
| *H01L 33/44* | (2010.01) |
| *H01L 33/62* | (2010.01) |

(52) U.S. Cl.
CPC ...... *H01L 25/0753* (2013.01); *H01L 21/6835* (2013.01); *H01L 33/44* (2013.01);
(Continued)

(58) Field of Classification Search
CPC ............ H01L 25/0753; H01L 21/6835; H01L 33/44; H01L 33/62; H01L 2221/68354;
(Continued)

(56) References Cited

U.S. PATENT DOCUMENTS

| | | | |
|---|---|---|---|
| 7,649,266 | B2 | 1/2010 | Ploessl et al. |
| 8,835,937 | B2 | 9/2014 | Wirth et al. |

(Continued)

FOREIGN PATENT DOCUMENTS

| | | |
|---|---|---|
| CN | 102544251 A | 7/2012 |
| CN | 103915530 A | 7/2014 |

(Continued)

*Primary Examiner* — Vu A Vu
(74) *Attorney, Agent, or Firm* — Slater Matsil, LLP

(57) ABSTRACT

In an embodiment a method includes arranging a first semiconductor wafer above a carrier, wherein the first semiconductor wafer includes a plurality of first semiconductor optoelectronic components, separating a plurality of the first components from the first semiconductor wafer by laser radiation so that the first components fall onto the carrier and attaching the first components separated from the first semiconductor wafer to the carrier, wherein regions of the first semiconductor wafer between adjacent first components are thinned and the first components are covered with a passivation layer before the first components are separated from the first semiconductor wafer.

13 Claims, 2 Drawing Sheets

(52) U.S. Cl.
CPC .... *H01L 33/62* (2013.01); *H01L 2221/68354* (2013.01); *H01L 2221/68363* (2013.01); *H01L 2221/68381* (2013.01); *H01L 2933/0025* (2013.01); *H01L 2933/0066* (2013.01)

(58) Field of Classification Search
CPC ........... H01L 2221/68363; H01L 2221/68381; H01L 2933/0025; H01L 2933/0066; H01L 33/0093; H01L 2224/81001; H01L 33/0095
USPC .......................................................... 438/28
See application file for complete search history.

(56) References Cited

U.S. PATENT DOCUMENTS

| | | | |
|---|---|---|---|
| 9,698,160 B2 * | 7/2017 | Wu | H01L 21/6835 |
| 10,121,945 B2 * | 11/2018 | Kim | H01L 33/483 |
| 10,276,764 B2 * | 4/2019 | Jansen | H01L 25/0753 |
| 10,361,351 B2 * | 7/2019 | Kwak | H01L 33/36 |
| 10,636,937 B2 * | 4/2020 | Liao | H01L 33/62 |
| 10,755,958 B2 | 8/2020 | Arai | |
| 11,024,611 B1 * | 6/2021 | Zou | H01L 21/67144 |
| 11,227,970 B1 * | 1/2022 | Oyer | H01L 33/06 |
| 2010/0258543 A1 | 10/2010 | Mizuno et al. | |
| 2017/0330857 A1 | 11/2017 | Zou et al. | |
| 2018/0219123 A1 | 8/2018 | Wang et al. | |

FOREIGN PATENT DOCUMENTS

| | | |
|---|---|---|
| JP | 2007523483 A | 8/2007 |
| JP | 2008508699 A | 3/2008 |
| JP | 2018060993 A | 4/2018 |
| TW | 200843017 A | 11/2008 |
| WO | 2018061896 A1 | 4/2018 |

* cited by examiner

METHOD FOR MANUFACTURING AN OPTOELECTRONIC LIGHT EMITTING DEVICE

This patent application is a national phase filing under section 371 of PCT/EP2019/085647, filed Dec. 17, 2019, which claims the priority of German patent application 10 2018 132 824.9, filed Dec. 19, 2018, each of which is incorporated herein by reference in its entirety.

TECHNICAL FIELD

The present invention relates to a method for manufacturing an optoelectronic light emitting device.

BACKGROUND

For future LEDs (light emitting diodes), in particular μLEDs, the placement of the components is becoming more and more demanding. The reasons for this are the required placement accuracy, which is becoming more difficult due to increasing miniaturization, the exclusion of defective components and the required repair mechanisms.

SUMMARY

Embodiments provide an advantageous method for manufacturing an optoelectronic light emitting device with which optoelectronic semiconductor components can be placed on a carrier in a reliable and cost-effective manner.

A method according to one embodiment is used to manufacture an optoelectronic light emitting device. First, a first semiconductor wafer is provided which comprises a plurality of first optoelectronic semiconductor components. Consequently, the first optoelectronic semiconductor components are not singulated at this time, but are still in the wafer compound. The first semiconductor wafer is the wafer on which the first optoelectronic semiconductor components are grown. The first semiconductor wafer contains semiconductor material, but does not have to consist exclusively of semiconductor material, but can also contain metal, for example.

The first semiconductor wafer is arranged above a carrier and, in a next step, a plurality of the first optoelectronic semiconductor components are separated from the first semiconductor wafer by means of laser radiation. The laser radiation may be a focused laser pulse generated by a laser and having enough energy so that a single optoelectronic semiconductor component can be detached from the wafer compound by means of the laser pulse. Due to gravity, the optoelectronic semiconductor components released from the wafer compound fall down onto the carrier arranged below the first semiconductor wafer.

The first optoelectronic semiconductor components separated from the first semiconductor wafer and fallen onto the carrier are attached to the carrier. The carrier with the first optoelectronic semiconductor components attached thereto forms the optoelectronic light emitting device.

The proposed transfer process eliminates the need to transfer the first optoelectronic semiconductor components individually from the first semiconductor wafer to the carrier. Furthermore, no re-bonding is required. Nevertheless, it is possible to selectively place the first optoelectronic semiconductor components at a desired location on the carrier. Consequently, the first optoelectronic semiconductor components can be placed on the carrier in a reliable and cost-effective manner using the described method.

The first optoelectronic semiconductor components may, for example, be light emitting diodes (LEDs), organic light emitting diodes (OLEDs), light emitting transistors or organic light emitting transistors. In various embodiments, the first optoelectronic semiconductor components may be part of an integrated circuit.

After the first optoelectronic semiconductor components have been detached from the wafer compound, they can be designed in particular as optoelectronic semiconductor chips.

In particular, the first optoelectronic semiconductor components can each be a μLED, i.e. a micro-LED. A μLED has only a very thin substrate or no substrate at all, which makes it possible to manufacture them with small lateral dimensions. For example, the edge length, i.e. lateral dimension, of a μLED can be in the range of 5 μm to 60 μm. For example, the thickness of a μLED can be in a range from 2 μm to 10 μm.

In order to facilitate the separation of the first optoelectronic semiconductor components by means of the laser radiation and also to predefine predetermined breaking points, areas of the first semiconductor wafer between adjacent first optoelectronic semiconductor components can be thinned beforehand, for example by applying suitable etching processes. Alternatively or additionally, the backside of the first semiconductor wafer can be etched.

Solder bumps can be placed on the carrier, which are heated before the first optoelectronic semiconductor components are separated from the first semiconductor wafer, for example to a temperature equal to or greater than the melting temperature of the solder material. The first optoelectronic semiconductor components are then "shot" into the liquid solder material of the solder bumps. After solidification of the solder material, the first optoelectronic semiconductor components are mechanically fixed to the carrier by the solder material. The solder bumps can contain a suitable solder material, for example Sn, In, AuIn or NiSn.

Due to the surface tension, the solder bumps can self-align the optoelectronic semiconductor components after they land.

The first optoelectronic semiconductor components may each comprise contact pads, for example anode and cathode contact pads, configured to electrically contact the optoelectronic semiconductor components from outside the optoelectronic semiconductor components. The first semiconductor wafer may be arranged above the carrier such that the contact pads face the carrier. After separation, the first optoelectronic semiconductor components fall with their contact pads onto the solder bumps. The solder bumps connect the contact pads mechanically to the carrier and also couple the optoelectronic semiconductor components electrically to the carrier or to components contained in the carrier.

The carrier can comprise a wiring layer to which the first optoelectronic semiconductor components fallen onto the carrier are electrically coupled, for example via the solder bumps. The wiring layer can couple the first optoelectronic semiconductor components to active and/or passive components integrated in the carrier.

After arranging the first semiconductor wafer above the carrier, a negative pressure or vacuum can be created in a space between the first semiconductor wafer and the carrier. The negative pressure causes a force on the first semiconductor wafer in the direction of the carrier. The negative pressure can be generated, for example, by a pump, in particular a vacuum pump. The negative pressure makes it possible to arrange the first semiconductor wafer at a very small distance above the carrier. Furthermore, the first optoelectronic semiconductor components "shot off" by the focused laser beam can fall onto the carrier without air resistance due to the vacuum, which prevents any tilting of the optoelectronic semiconductor components possibly caused by the air resistance.

The carrier may comprise through-holes through which air is pumped from the space between the first semiconductor wafer and the carrier to create the negative pressure. The through holes may extend from a first main surface of the carrier to a second main surface of the carrier opposite the first main surface.

The carrier can comprise supporting pillars and/or supporting walls on which the first semiconductor wafer is placed before the first optoelectronic semiconductor components are released from the first semiconductor wafer by means of the focused laser beam. The support pillars or walls offer the advantage of creating a defined distance of the first semiconductor wafer from the carrier. For example, the distance can be in the range of 10 μm to 50 μm. The distance can be selected depending on the size of the optoelectronic semiconductor components and/or the size of the contact pads and can be optimized accordingly.

According to one embodiment, a second semiconductor wafer is provided comprising a plurality of second optoelectronic semiconductor components. The second semiconductor wafer is arranged above the carrier and a plurality of the second optoelectronic semiconductor components are separated from the second semiconductor wafer by means of a focused laser beam, in particular a laser pulse. The second optoelectronic semiconductor components released from the wafer compound fall onto the carrier and are attached to the carrier.

The second semiconductor wafer as well as the second optoelectronic semiconductor components included in the second semiconductor wafer may comprise the above-described embodiments of the first semiconductor wafer and the first optoelectronic semiconductor components, respectively.

Furthermore, additional semiconductor wafers can be provided, which contain further optoelectronic or otherwise designed semiconductor components, which are separated and attached to the carrier by means of the described method. The various semiconductor wafers can be arranged one after the other above the carrier and their semiconductor components can be attached to the carrier at the respective desired locations.

The first optoelectronic semiconductor components may be configured to emit light of a first color and the second optoelectronic semiconductor components may be configured to emit light of a second color, the first and second colors being different colors. If third optoelectronic semiconductor components are provided that are taken from a third semiconductor wafer, they may be configured to emit light of a third color. For example, the three colors may be the primary colors red, green, and blue.

Optoelectronic semiconductor components emitting light of the colors red, green and blue can each be placed next to each other on the carrier. Three optoelectronic semiconductor components with the colors red, green and blue placed next to each other can form a pixel. Several pixels can be arranged in a matrix of rows and columns, for example.

The carrier to which the optoelectronic semiconductor components are attached may be another semiconductor wafer. As described above, the semiconductor wafer used as a carrier may include a wiring layer and active and/or passive components integrated into the semiconductor wafer. For example, the semiconductor wafer may comprise thin-film transistors (TFT), which are used to drive the optoelectronic semiconductor components.

Instead of a semiconductor wafer, a differently designed substrate can also be used as a carrier.

The carrier does not have to be circular like typical semiconductor wafers, but can be rectangular, for example, or comprise another suitable basic form.

The optoelectronic light emitting device manufactured by the method described herein may be a display, i.e., an optical display device.

Furthermore, the optoelectronic light emitting device can be used in video walls, RGB displays or display panels, for example. Furthermore, the optoelectronic light emitting device can be used in vehicle applications. For example, the optoelectronic light emitting device can be integrated into displays, particularly in the dashboard, of vehicles.

BRIEF DESCRIPTION OF THE DRAWINGS

In the following, embodiments of the invention are explained in more detail with reference to the accompanying drawings.

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

DETAILED DESCRIPTION OF ILLUSTRATIVE EMBODIMENTS

Figure 1:
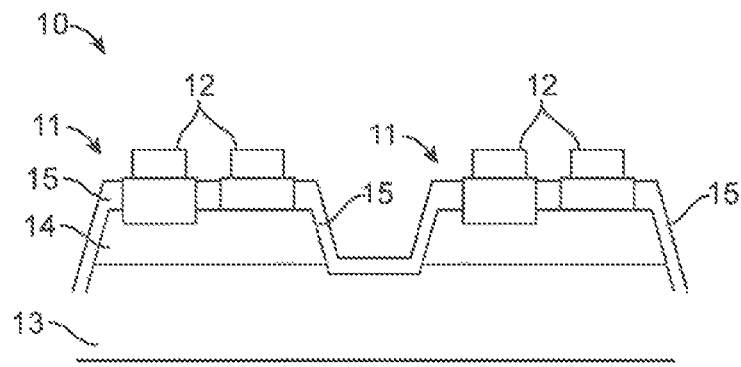
FIG. 1 shows a semiconductor wafer with multiple optoelectronic semiconductor components.

FIG. 1 shows a section of a semiconductor wafer 10 in cross-section with a plurality of optoelectronic semiconductor components, which in the present embodiment are formed as LEDs 11, in particular as μLEDs. In FIG. 1, two LEDs 11 are shown as an example. In FIG. 1, the LEDs 11 are located in the wafer compound of the semiconductor wafer 10 on which the LEDs 11 are grown.

In the present embodiment, the semiconductor wafer 10 is a sapphire wafer on which the LEDs 11 are manufactured in a flip-chip configuration, i.e., the LEDs 11 can be mounted directly with their contact surfaces or contact pads 12 on a carrier in a subsequent process step without the need for further connecting wires, in particular bonding wires, for contacting.

The semiconductor wafer 11 comprises, among other things, a sapphire layer 13, i.e., a layer of $Al_2O_3$, and a layer 14 of GaN. The GaN layer 14 is etched down to the sapphire layer 13 between adjacent LEDs 11. The GaN layer 14 is then covered with a passivation layer 15, leaving the contact pads 12 of the LEDs 11 exposed. In the present embodiment, the contact pads 12 are made of gold and serve to make electrical contact with the p or n terminals of the respective LED 11.

In a further step, the backside of the semiconductor wafer 11, i.e. the sapphire layer 13, is sufficiently thinned and polished.

Figure 2A:
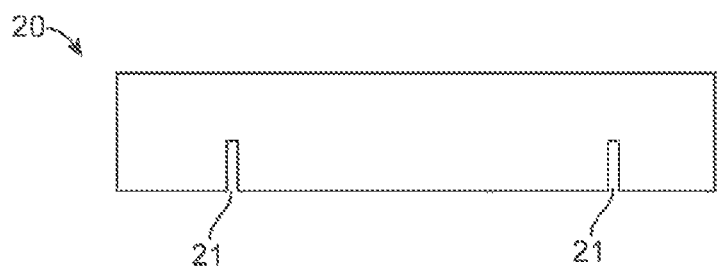
FIGS. 2A to 2C show a method for manufacturing a carrier for an optoelectronic light emitting device.

FIG. 2 shows a cross-section of a silicon wafer 20, which is to serve as a carrier for the LEDs 11. Active and/or passive components may be integrated into the silicon wafer 20, which are not shown in FIG. 2A. Furthermore, the silicon wafer 20 may comprise one or more wiring layer(s) also not shown in FIG. 2A.

Holes 21 formed as blind holes are first etched into the backside of the silicon wafer 20, with the holes 21 occupying only a small portion of the backside of the silicon wafer 20.

Figure 2B:
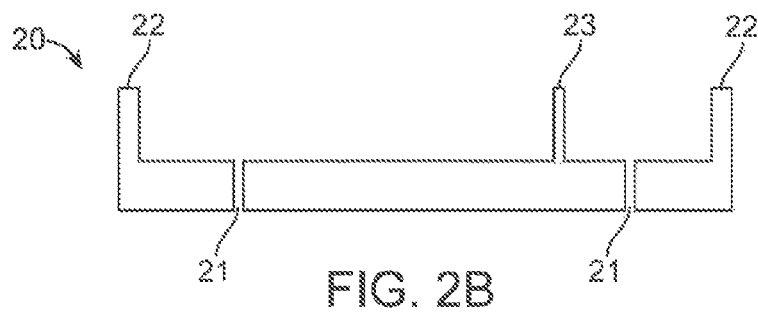

In the next step, shown in FIG. 2B, the front side of the silicon wafer 20 is etched. However, the edge region 22 and support pillars 23 or support walls remain. As an example, one of the support pillars 23 is shown in FIG. 2B. The function of the support pillars 23 is explained further below.

The front side of the silicon wafer 20 is etched to such an extent that the holes 20 are exposed at the front side and, in addition, the edge region 22 and the support pillars 20 have a defined height, for example 20 µm. The holes 20 are consequently formed into through holes in the step shown in FIG. 2B. The support pillars 20 occupy only a small portion of the front side of the silicon wafer 20.

Figure 2C:
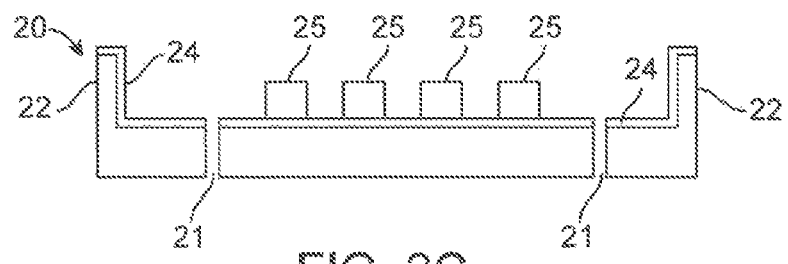

In the next step, shown in FIG. 2C, a passivation layer 24 of $SiO_2$ and solder bumps 25 are applied to the front side of the silicon wafer 20. The solder bumps 25 are placed on contact pads of the silicon wafer 20.

Figure 3A:
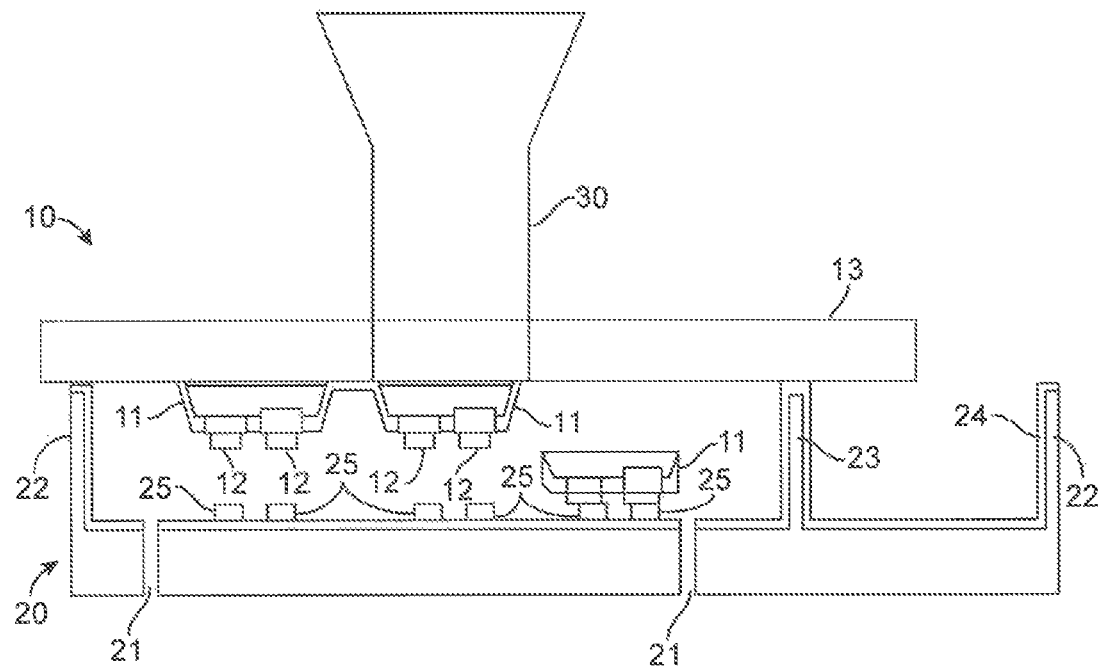
FIGS. 3A and 3B show a method for manufacturing an optoelectronic light emitting device using the semiconductor wafer of FIG. 1 and the carrier of FIG. 2C.
Figure 3B:
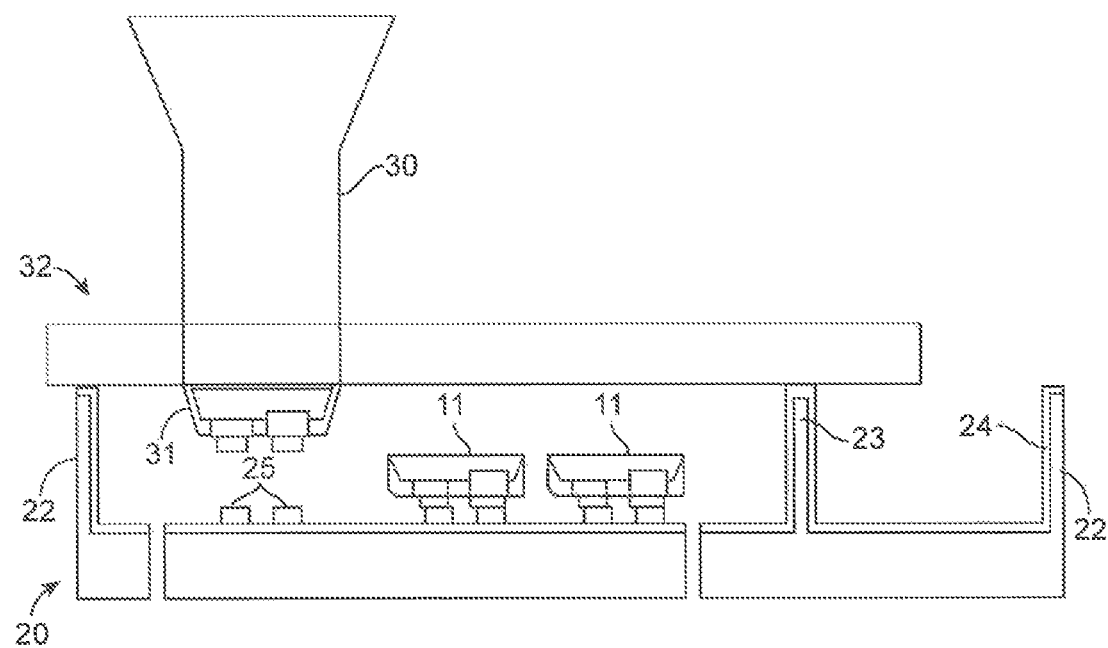

FIGS. 3A and 3B schematically show the manufacturing of an optoelectronic light emitting device in the form of at least part of a display from the semiconductor wafer 10 shown in FIG. 1 and the silicon wafer 20 shown in FIG. 2C.

The semiconductor wafer 10 or the sapphire layer 13 of the semiconductor wafer 10 is placed on the edge region 22 and/or the supporting pillars 23 of the silicon wafer 20 in such a way that the contact pads 12 of the LEDs 11 point in the direction of the silicon wafer 20. Due to the predetermined height of the edge region 22 and the supporting pillars 23, the distance between the LEDs 11 integrated in the semiconductor wafer 10 and the silicon wafer 20 can be precisely specified.

After placing the semiconductor wafer 10 on the edge region 22 and/or the support pillars 23 of the silicon wafer 20, either the entire chamber in which the semiconductor wafer 10 and the silicon wafer 20 are located is evacuated or only a negative pressure is created in the space between the semiconductor wafer 10 and the silicon wafer 20 by sucking air through the holes 21 in the silicon wafer 20 by means of a pump. The negative pressure causes a force on the semiconductor wafer 10 in the direction of the silicon wafer 20. The support pillars 23 prevent the semiconductor wafer 10 from bending. Furthermore, the contact pads 12 of the LEDs 11 are not oxidized during subsequent heating and tilting of the separated LEDs 11 due to in-flight turbulence is avoided. If the entire chamber is evacuated, for example due to a lack of rigidity of the semiconductor wafer 10, the semiconductor wafer 10 and the silicon wafer 20 can be locked in place by means of a clamp.

At least the silicon wafer 20 is then heated to the melting temperature of the solder material so that the solder bumps 25 are in a liquid state.

The semiconductor wafer 10 is positioned above the silicon wafer 20 in lateral direction in such a way that certain LEDs 11 are located directly above a desired positioning on the silicon wafer 20. By means of a focused laser pulse 30, these LEDs 11 are selectively "fired" one after the other and fall onto the silicon wafer 20 due to the force of gravity. The laser pulse 30 heats in particular the epitaxial layer of the respective LEDs 11, whereby the LEDs 11 or LED chips are released from the wafer compound.

The "launched" LEDs 11 land with their contact pads 12 on the respective solder bumps 25. If necessary, the surface tension of the liquid solder bumps 25 causes the LEDs 11 to be displaced to a desired position after landing.

Due to the short flight distance, the vacuum and the liquid solder material, the individual LEDs 11 stick to the silicon wafer 20 or are immediately pressed into the liquid solder material by their kinetic energy.

The solder material then solidifies. The solidified solder material mechanically fixes the LEDs 11 to the silicon wafer 20, which serves as a carrier. In addition, the solder material causes an electrical coupling of the LEDs 11 to the active and/or passive components integrated in the silicon wafer 20.

After selectively placing LEDs 11, LEDs 31 can be placed on silicon wafer 20 in the same manner. The LEDs 11 and 31 may emit light with different colors. As shown in FIG. 3B, the LEDs 31 can be integrated into a second semiconductor wafer 32, which is arranged above the silicon wafer 20 in the same way as the first semiconductor wafer 10 before, in order to be able to separate the LEDs 31 at the desired locations by means of a focused laser pulse 30 and place them on the silicon wafer 20.

The method described allows LEDs emitting the primary colors red, green and blue to be sequentially attached to the silicon wafer 20 serving as the carrier. Red light emitting LEDs could be released from the wafer compound, for example, using an infrared (IR) laser and an absorbing GaInNAs layer. On the other hand, GaN could also be used for red light emitting LEDs as soon as available.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A method for manufacturing an optoelectronic light emitting device, the method comprising:
   arranging a first semiconductor wafer above a carrier, wherein the first semiconductor wafer comprises a plurality of first semiconductor optoelectronic components;
   separating the first components from the first semiconductor wafer by laser radiation so that the first components fall onto the carrier; and
   attaching the first components separated from the first semiconductor wafer to the carrier,
   wherein regions of the first semiconductor wafer between adjacent first components are thinned and the first components are covered with a passivation layer before the first components are separated from the first semiconductor wafer.

2. The method according to claim 1, wherein the first optoelectronic semiconductor components are µLEDs.

3. The method according to claim 1, further comprising:
placing solder bumps on the carrier;
heating the solder bumps before separating the first components from the first semiconductor wafer; and
fixing the first components fallen onto the carrier to the carrier by the heated solder bumps.

4. The method according to claim 3, wherein each first component comprises contact pads, wherein the first semiconductor wafer is arranged above the carrier such that the contact pads face the carrier, and wherein the solder bumps connect the contact pads of the first components fallen onto the carrier to the carrier.

5. The method according to claim 1, wherein the carrier comprises a wiring layer to which the first components when fallen onto the carrier are electrically coupled.

6. The method according to claim 1, further comprising, after arranging the first semiconductor wafer above the carrier, generating a negative pressure in a space between the first semiconductor wafer and the carrier.

7. The method according to claim 6, wherein the carrier comprises through holes through which air is pumped from the space between the first semiconductor wafer and the carrier to create the negative pressure.

8. The method according to claim 1, wherein the carrier comprises carrier pillars and/or carrier walls on which the first semiconductor wafer is placed.

9. The method according to claim 1, further comprising:
arranging a second semiconductor wafer above the carrier, wherein the second semiconductor wafer comprise a plurality of second optoelectronic semiconductor components;
separating a plurality of the second components from the second semiconductor wafer by laser radiation and fall onto said carrier; and
attaching the second components separated from the second semiconductor wafer to the carrier.

10. The method according to claim 9, wherein the first components are configured to emit light of a first color and the second components are configured to emit light of a second color.

11. The method according to claim 1, wherein the carrier is a further semiconductor wafer.

12. The method according to claim 1, wherein the optoelectronic light emitting device is a display.

13. A method for manufacturing an optoelectronic light emitting device, the method comprising:
arranging a semiconductor wafer above a carrier, wherein the semiconductor wafer comprises a plurality of optoelectronic semiconductor components;
generating a negative pressure in a space between the semiconductor wafer and the carrier after arranging the semiconductor wafer above the carrier, wherein the carrier comprises through holes through which air is pumped from the space between the semiconductor wafer and the carrier to generate the negative pressure;
separating the components from the semiconductor wafer by laser radiation so that the components fall onto the carrier; and
attaching the components separated from the semiconductor wafer to the carrier.

* * * * *